United States Patent
Shibata et al.

(10) Patent No.: US 6,706,620 B2
(45) Date of Patent: Mar. 16, 2004

(54) METHOD FOR FABRICATING A NITRIDE FILM

(75) Inventors: Tomohiko Shibata, Nagoya (JP); Mitsuhiro Tanaka, Nagoya (JP); Keiichiro Asai, Nagoya (JP); Osamu Oda, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 16 days.

(21) Appl. No.: 10/074,589

(22) Filed: Feb. 13, 2002

(65) Prior Publication Data

US 2002/0155649 A1 Oct. 24, 2002

Related U.S. Application Data

(60) Provisional application No. 60/303,023, filed on Jul. 5, 2001.

(30) Foreign Application Priority Data

Feb. 27, 2001 (JP) ......................................... 2001-053188

(51) Int. Cl.[7] ................................................. H01L 21/28
(52) U.S. Cl. ........................................... 438/604; 257/97
(58) Field of Search .......................... 438/604, 29, 32, 438/47, 45, 87, 940; 257/97, 103, 201

(56) References Cited

U.S. PATENT DOCUMENTS

| | | | | |
|---|---|---|---|---|
| 6,133,589 A | * | 10/2000 | Krames et al. | ............. 257/103 |
| 6,495,894 B2 | * | 12/2002 | Shibata et al. | ............. 257/428 |
| 6,534,797 B1 | * | 3/2003 | Edmond et al. | ............. 257/97 |
| 2002/0020850 A1 | | 2/2002 | Shibata et al. | |

FOREIGN PATENT DOCUMENTS

| | | |
|---|---|---|
| JP | 09-083016 A | 3/1997 |
| JP | 11-103134 A | 4/1999 |
| JP | 2000-228535 A | 8/2000 |
| JP | 2001-230447 A | 8/2001 |

OTHER PUBLICATIONS

U.S. patent application Ser. No. 09/981,295, Shibata et al., filed Oct. 16, 2001.
U.S. patent application Ser. No. 10/102,545, Shibata et al., filed Mar. 20, 2002.
U.S. patent application Ser. No. 10/163,256, Shibata et al., filed Jun. 5, 2002.

* cited by examiner

Primary Examiner—David Nelms
Assistant Examiner—David Vu
(74) Attorney, Agent, or Firm—Burr & Brown

(57) ABSTRACT

A lower region having a composition of $Al_{x1}Ga_{x2}In_{x3}N$ ($x1+x2+x3=1$, $0.5 \leq x1 \leq 1.0$) is formed through epitaxial growth by a CVD method, and subsequently, an upper region having a composition of $Al_{y1}Ga_{y2}In_{y3}N$ ($y1+y2+y3=1$, $0 \leq y1 \leq x1-0.1$) is formed through epitaxial growth by a CVD method. A boundary face divides a given III nitride film into the lower region and the upper region and the lower and upper regions have an Al content difference of 10 atomic percent or more.

10 Claims, 1 Drawing Sheet

METHOD FOR FABRICATING A NITRIDE FILM

CROSS REFERENCE TO RELATED APPLICATION

This application claims the benefit of U.S. Provisional Application Ser. No. 60/303,023 filed Jul. 5, 2001 and Japanese Application 2001-053,188, filed Feb. 27, 2001, the entireties of which are incorporated herein by reference.

BACKGROUND OF THE INVENTION

(1) Field of the Invention

This invention relates to a method for fabricating a nitride film, particularly a III nitride film usable as an underfilm of a semiconductor element such as a light-emitting diode or a high velocity IC chip.

(2) Related Art Statement

III nitride films are employed as semiconductor films for photonic devices constituting a light-emitting diode, etc., and recently, win a lot of attention as semiconductor films for electronic devices, for example, constituting high velocity IC chips to be used in cellular phones.

Such III nitride films are usually fabricated by MOCVD methods. Concretely, a substrate on which III nitride films are formed is set onto a susceptor installed in a given reactor, and then, heated to 1000° C. or more with a heater provided in or out of the susceptor. Thereafter, raw material gases are introduced with a carrier gas into the reactor and supplied onto the substrate.

On the substrate, the raw material gases are dissolved through thermochemical reaction into constituent elements, which are reacted to deposit and fabricate a desired III nitride film on the substrate.

The lattice constant of the III nitride film is affected largely by the composition of the film itself. Therefore, if the composition of the III nitride film is selected, the difference in the lattice constant between the substrate and the III nitride film may become large, so that many misfit dislocations may be created at the boundary between the substrate and the III nitride film.

In this case, if another III nitride film is epitaxially grown on the III nitride film, a large amount of dislocation density of about $10^{10}/cm^2$ may be created in the epitaxially grown film because the misfit dislocations are propagated. As a result, the crystal quality of the epitaxially grown film may be deteriorated, and the electrical properties and the optical properties may be deteriorated.

In order to solve the above problem, such an attempt is made as fabricating a patterned mask made of $SiO_2$ on a substrate and epitaxially growing a given III nitride film laterally on the mask. In this case, misfit dislocations originated from the interface between the substrate and the film are not propagated vertically but propagate laterally above the mask. As a result, the threading dislocation density above the mask is reduced.

In the fabrication of the patterned mask, however, since a photo-lithography process including an etching operation is required, the total fabrication process for the III nitride film may become complicated.

SUMMARY OF THE INVENTION

It is an object of the present invention to provide a method capable of easily fabricating a III nitride film with a lower dislocation density.

In order to achieve the above object, this invention relates to a method for fabricating a III nitride film and includes the steps of forming a lower region having a composition of $Al_{x1}Ga_{x2}In_{x3}N$ (x1+x2+x3=1, $0.5 \leq x1 \leq 1.0$), and forming an upper region having a composition of $Al_{y1}Ga_{y2}In_{y3}N$ (y1+y2+y3=1, $0 \leq y1 \leq x1-0.1$). A boundary face is created and divides a given III nitride film into the lower region and the upper region, with the Al content difference being 10 atomic percent or more between the lower and upper regions.

The inventors intensely studied to obtain a III nitride film with lower dislocation density through an easy fabricating process without the need to use a patterned mask made of $SiO_2$. As a result, they found out that by forming the above-mentioned boundary face in the III nitride film, the dislocation density of the III nitride film can be reduced, and thus, the crystal quality of the III nitride film can be improved.

FIG. 1 is an explanatory view of a fabricating method of a III nitride film according to the present invention. In a III nitride film 1 including Al element shown in FIG. 1, a boundary face 2 is formed and thus, the III nitride film is divided into two regions 3 and 4. The Al content of the upper region 4 is lower than the Al content of the lower region 3 by 10 atomic percent or more. Herein, the Al content of the lower region 3 is set to 50 atomic percent or more. In this case, the Al content as mentioned above is defined as the amount included in all of the III elements in the III nitride film.

The III nitride film 1 is fabricated on a given substrate (not shown), and thus, many dislocations may be created, which originated from the dislocations contained in the substrate and the misfit dislocations between the substrate and the III nitride film 1 due to the large difference in lattice constants.

However, the dislocation propagation in the III nitride film can be inhibited by the boundary face 2. Therefore, if many dislocations are propagated in the III nitride film 1, they can not be propagated beyond the boundary face 2, and thus, remain only in the lower region 3 or at the boundary face 2. As a result, the dislocation density of the III nitride film can be reduced in the upper region 4.

As a result, the crystal quality of the upper region 4 of the III nitride film 1 can be improved. Therefore, if a given function is provided in the upper region 4 in advance, the III nitride film 1 can be employed as a given semiconductor film entirely.

Particularly, the III nitride film 1 is preferably used as an underfilm of a semiconductor element such as a semiconductor light-emitting element, e.g., a light-emitting diode or a high velocity IC chip. In this case, since another semiconductor layer is fabricated on the upper region 4 of the III nitride film 1, which has a good crystal quality, the crystal quality of the semiconductor layer can be improved. As a result, the luminous efficiency or the high velocity response of the semiconductor element can be remarkably enhanced.

BRIEF DESCRIPTION OF THE DRAWINGS

For better understanding of the present invention, reference is made to the attached drawings, wherein.

DETAILED DESCRIPTION OF THE INVENTION

Figure 1:
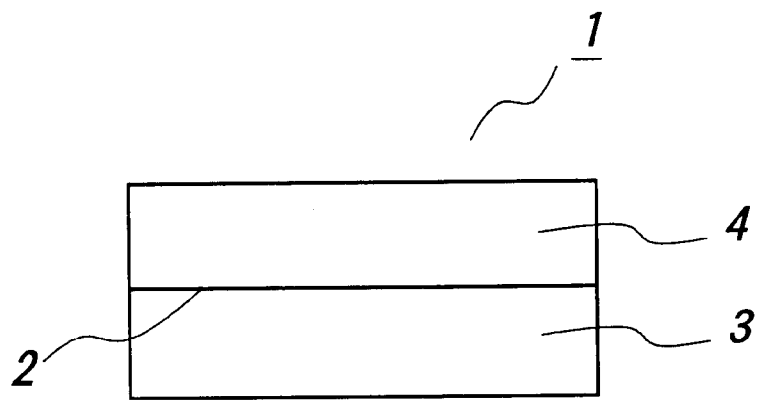
FIG. 1 is an explanatory view of a fabricating method of III nitride film according to the present invention.

This invention will be described in detail, with reference to FIGS. 1 and 2, hereinafter. In the fabricating method of the III nitride film of the present invention, a boundary face is formed in a III nitride film to be divided in two region in the thickness direction. The composition of the divided lower region is defined as $Al_{x1}Ga_{x2}In_{x3}N$ (x1+x2+x3=1), and the composition of the divided upper region is defined as $Al_{y1}Ga_{y2}In_{y3}N$ (y1+y2+y3=1). Also, it is required that the relations of $0.5 \leq x1 \leq 1.0$ and $0 \leq y1 \leq x1-0.1$ are satisfied. Moreover, it is desired that the relations of $0.7 \leq x1 \leq 1.0$ and $0 \leq y1 \leq x1-0.5$ are satisfied. In this case, the dislocation propagation can be inhibited more effectively by the boundary face, and thus, the dislocation density of the upper region from the boundary face can be drastically reduced.

As mentioned above, the lower region has the composition of $Al_{x1}Ga_{x2}In_{x3}N$ (x1+x2+x3=1, $0.5 \leq x1 \leq 1.0$), and preferably made at 1100° C. or more. In this case, the screw-type dislocations and the mixed dislocations in the lower region of the III nitride film disappear effectively, and thus, the dislocation density of the upper region of the III nitride film can be also improved more effectively.

In this case, the crystallinity of the lower region of the III nitride film can be also improved entirely up to a full width of half maximum (FWHM) of X-ray rocking curve value of 90 seconds or below at (002) reflection, and thus, the crystallinity of the upper region can be also enhanced, compared with a conventional III nitride film fabricated by using a buffer layer fabricated at a lower temperature.

The upper limit value of the fabrication temperature of the lower region of the III nitride film is not restricted, but is preferably set to be 1250° C. If the upper limit value is set at a temperature beyond 1250° C., the dislocations are not inhibited as much, and particularly, the crystal quality of the upper region of the III nitride film may be deteriorated due to the surface roughness.

The III nitride film is made, preferably at 1100° C. or more, by a MOCVD method using an Al raw material gas, a nitrogen raw material gas and another raw material gas such as a Ga raw material gas. In forming the lower region, the amount of supplied Al raw material gas is set larger, and in forming the upper region, the amount of the supplied Al raw material gas is set smaller, so that the Al content in the upper region is set smaller than the Al content in the lower region by 10 atomic percent or more.

According to the above-mentioned fabricating method, the boundary face is formed and divides the III nitride film into the lower region and the upper region stepwisely to have a difference in Al content of 10 atomic percent or more.

As mentioned above, the dislocation propagation can be inhibited by the boundary face, and thus, the dislocation density in the upper region can be reduced one-fifth as much as that in the lower region, and concretely can be reduced up to $10^8$–$10^{10}$/cm$^2$.

As a result, the crystallinity of the upper region of the III nitride film can be improved up to a FWHM of X-ray rocking curve value of 300 seconds or below at (002) reflection, which is remarkably enhanced in comparison with a conventional III nitride film fabricated by using a buffer layer formed at a lower temperature.

Figure 2:
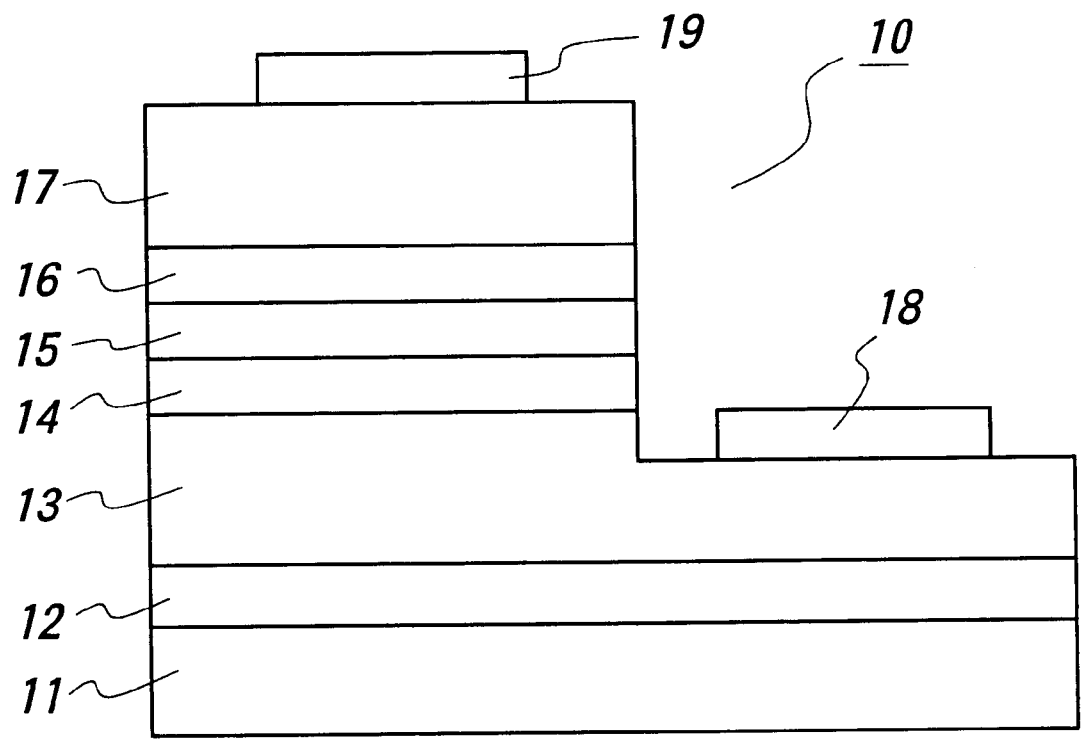
FIG. 2 is a cross sectional view showing a semiconductor light-emitting element using a III nitride film as an underfilm (under layer) fabricated according to the present invention.

FIG. 2 is a cross sectional view showing a semiconductor light-emitting element using a III nitride film as an underfilm (under layer) fabricated according to the fabricating method as mentioned above.

A semiconductor light-emitting element 10 depicted in FIG. 2 includes a substrate 11, an under layer 12 fabricated according to the fabricating method of the present invention, and a first conductive layer 13 made of, e.g., n-AlGaN.

Moreover, the semiconductor light-emitting element 10 includes, on the first conductive layer 13, a first cladding layer 14 made of, e.g., n-AlGaN, a light-emitting layer 15 made of, e.g., i-AlGaN and formed on the first cladding layer 14, a second cladding layer 16 made of, e.g., p-AlGaN and formed on the light-emitting layer 15, and a second conductive layer 17 made of, e.g., p-AlGaN and formed on the second cladding layer 16.

The first conductive layer 13 is partially exposed and an n-type electrode 18 made of, e.g., Al/Ti is provided on the exposed surface of the layer 13. Then, a p-type electrode 19 made of, e.g., Au/Ni, is provided on the second conductive layer 17.

As mentioned above, since the under layer 12 is made according to the fabricating method of the present invention, the crystal quality of the surface layer of the under layer 12 is improved. Therefore, since the crystal qualities of the conductive layers, the cladding layers and the light-emitting layer are also improved, the luminous efficiency of the semiconductor light-emitting element can be enhanced.

Each layer such as the conductive layer or the cladding layer, of the semiconductor light-emitting element may be made by a well known MOCVD method.

EXAMPLES

This invention will be concretely described, hereinafter.

Example

A C-faced sapphire single crystal substrate was employed, and then, set and attracted on a susceptor installed in a quartz reactor of a MOCVD apparatus, and heated to 1200° C. with a heater built in the susceptor.

Then, a trimethylaluminum (TMA) as an Al raw material gas and an ammonia (NH$_3$) gas as a nitrogen raw material gas were introduced and supplied with a hydrogen carrier gas onto the substrate at the flow rate of TMA/NH$_3$=0.5 sccm/350 sccm, to form an AlN film (lower region) in a thickness of 1 μm through the epitaxial growth for 60 minutes.

The dislocation density of the AlN film was $10^{10}$/cm$^2$ according to TEM observation, and the FWHM of the AlN film was about 50 seconds at (002) reflection by X-ray diffraction.

Then, the temperature of the substrate was varied to 1050° C. from 1200° C., and a trimethylgallium (TMG) as a Ga raw material gas was introduced with the TMA gas and the NH$_3$ gas at the flow rate of TMA/TMG/NH$_3$=0.1 sccm/0.9 sccm/3000 sccm, to form an Al$_{0.1}$Ga$_{0.9}$N film (upper region) in a thickness of 2 μm through the epitaxial growth for 60 minutes, and thus, to form a III nitride film constructed of the AlN film and the Al$_{0.1}$Ga$_{0.9}$N film.

The dislocation density of the Al$_{0.1}$Ga$_{0.9}$N film was $10^9$/cm$^2$ according to TEM observation, and the FWHM of the Al$_{0.1}$Ga$_{0.9}$N film was about 150 seconds at (002) reflection by X-ray diffraction.

Comparative Example

A C-faced sapphire single crystal substrate was set on the susceptor and heated at 600° C. by the heater built in the susceptor. Then, the TMA, the TMG and the NH$_3$ gas were introduced and supplied onto the substrate, to form a buffer layer in a thickness of about 200 Å. Then, the temperature of the substrate was varied to 1050° C. from 600° C., the same Al$_{0.1}$Ga$_{0.9}$N film was formed in a thickness of 2 μm, to a III nitride film constructed of the buffer layer and the Al$_{0.1}$Ga$_{0.9}$N film.

The dislocation density of the Al$_{0.1}$Ga$_{0.9}$N film was $2 \times 10^{10}$/cm$^2$ according to TEM observation, and the FWHM of the Al$_{0.1}$Ga$_{0.9}$N film was about 350 seconds at (002) reflection by X-ray diffraction.

As is apparent from the Example and the Comparative Example, the dislocation density in the Al$_{0.1}$Ga$_{0.9}$N film of the upper region of the resulting III nitride film in the Example is lowered one-fifth or below as much as that in the Comparative Example, and the crystallinity of the Al$_{0.1}$Ga$_{0.9}$N film of the upper region in the Example is more enhanced than that in the Comparative Example.

Therefore, if the III nitride film in the Example, which is fabricated according to the present invention, is employed as an underfilm of a semiconductor light-emitting element, the crystal qualities of various semiconductor layer to be formed on the III nitride film can be improved and thus, the performance such as luminous efficiency of the semiconductor light-emitting element can be enhanced. Similarly, if the III nitride film in the Example is employed as an underfilm of a high velocity IC chip, the crystal qualities of various semiconductor layer to be formed on the III nitride film can be improved and thus, the performance such as response property of the IC chip can be enhanced.

Although the present invention was described in detail with reference to the above Examples, this invention is not limited to the above disclosure and every kind of variation and modification may be made without departing from the scope of the present invention.

As is explained above, a III nitride film of low dislocation density and thus, good crystal quality can be easily fabricated, according to the present invention. Therefore, if the III nitride film is employed as an underfilm of a given semiconductor element, the crystal quality of the element can be totally improved, and thus, the performance of the element can be enhanced.

What is claimed is:

1. A method for fabricating a III nitride film, comprising the steps of:

forming a lower region having a composition of Al$_{x1}$Ga$_{x2}$In$_{x3}$N (x1+x2+x3=1, 0.5≦x1≦1.0); and forming an upper region having a composition of Al$_{y1}$Ga$_{y2}$In$_{y3}$N (y1+y2+y3=1, 0≦y1≦x1−0.1), whereby a boundary face divides a given III nitride film into the lower region and the upper region and the difference in the Al content between the upper and lower regions is 10 atomic percent or more, and the full width at half maximum in X-ray rocking curve value of said lower region is 90 seconds or below.

2. A fabricating method as defined in claim 1, wherein said lower region is created at 1100° C. or more by a MOCVD method.

3. A fabricating method as defined in claim 2, wherein said lower region is created within 1100–1250° C.

4. A fabricating method as defined in claim 1, wherein the Al content of said III nitride film is varied stepwisely in the thickness direction.

5. A fabricating method as defined in claim 1, wherein the dislocation density of said upper region is one-fifth as large as the dislocation density of said lower region.

6. A fabricating method as defined in claim 1, wherein the full width at half maximum in X-ray rocking curve value of said upper region is 300 seconds or below.

7. An underfilm for a semiconductor element including a III nitride film fabricated according to a fabricating method as defined in claim 1.

8. A semiconductor element including an underfilm for a semiconductor element as defined in claim 7.

9. An underfilm for a semiconductor light-emitting element including a III nitride film fabricated according to a fabricating method as defined in claim 1.

10. A semiconductor light-emitting element including an underfilm for a semiconductor light-emitting element as defined in claim 9.

* * * * *